(12) United States Patent
Koyama et al.

(10) Patent No.: US 9,806,498 B2
(45) Date of Patent: Oct. 31, 2017

(54) VERTICAL-CAVITY SURFACE-EMITTING LASER DIODE AND OPTICAL TRANSMISSION APPARATUS

(71) Applicants: TOKYO INSTITUTE OF TECHNOLOGY, Tokyo (JP); FUJI XEROX CO., LTD., Tokyo (JP)

(72) Inventors: Fumio Koyama, Tokyo (JP); Hamed Dalir, Tokyo (JP); Takashi Kondo, Ebina (JP); Naoki Jogan, Ebina (JP); Kazutaka Takeda, Ebina (JP); Hideo Nakayama, Ebina (JP)

(73) Assignees: TOKYO INSTITUTE OF TECHNOLOGY, Tokyo (JP); FUJI XEROX CO., LTD., Tokyo (JP)

(*) Notice: Subject to any disclaimer, the term of this patent is extended or adjusted under 35 U.S.C. 154(b) by 0 days.

(21) Appl. No.: 15/143,653

(22) Filed: May 2, 2016

(65) Prior Publication Data

US 2016/0248227 A1    Aug. 25, 2016

Related U.S. Application Data

(63) Continuation of application No. 14/452,053, filed on Aug. 5, 2014, now Pat. No. 9,350,139.

(30) Foreign Application Priority Data

Aug. 7, 2013   (JP) .................................. 2013-163757

(51) Int. Cl.
*H01S 5/183*      (2006.01)
*H01S 5/10*       (2006.01)
(Continued)

(52) U.S. Cl.
CPC ........ *H01S 5/1835* (2013.01); *H01S 5/02284* (2013.01); *H01S 5/1032* (2013.01);
(Continued)

(58) Field of Classification Search
CPC .... H01S 5/1028–5/1032; H01S 5/0625; H01S 5/06251; H01S 5/06255; H01S 5/18311–5/18313
See application file for complete search history.

(56) References Cited

U.S. PATENT DOCUMENTS

| 4,817,106 A * | 3/1989 | Thompson ............ H01S 5/1032 372/19 |
| 5,446,754 A | 8/1995 | Jewell et al. |

(Continued)

FOREIGN PATENT DOCUMENTS

| JP | 11-274640 A | 10/1999 |
| JP | 2000-294872 A | 10/2000 |

(Continued)

OTHER PUBLICATIONS

Communication dated Mar. 14, 2017, from the Japanese Patent Office in counterpart application No. 2013-163757.

*Primary Examiner* — Xinning Niu
*Assistant Examiner* — Sean Hagan
(74) *Attorney, Agent, or Firm* — Sughrue Mion, PLLC

(57) ABSTRACT

A vertical-cavity surface-emitting laser diode includes: a first resonator that has a plurality of semiconductor layers comprising a first current narrowing structure having a first conductive region and a first non-conductor region; a first electrode that supplies electric power to drive the first resonator; a second resonator that has a plurality of semiconductor layers comprising a second current narrowing structure having a second conductive region and a second non-conductive region and that is formed side by side with the first resonator, the second current narrowing structure being formed in same current narrowing layer as the layer where the first current narrowing structure is formed; and a coupling portion as defined herein; and an equivalent refrac- (Continued)

tive index of the coupling portion is smaller than an equivalent refractive index of each of the first resonator and the second resonator.

10 Claims, 8 Drawing Sheets

(51) Int. Cl.
  *H01S 5/343* (2006.01)
  *H01S 5/022* (2006.01)
  *H01S 5/062* (2006.01)

(52) U.S. Cl.
  CPC ...... *H01S 5/18302* (2013.01); *H01S 5/18313* (2013.01); *H01S 5/18344* (2013.01); *H01S 5/3432* (2013.01); *H01S 5/06226* (2013.01); *H01S 5/18394* (2013.01)

(56) References Cited

U.S. PATENT DOCUMENTS

| 5,903,590 | A | 5/1999 | Hadley et al. |
| 6,365,427 | B1 | 4/2002 | Gauggel et al. |
| 6,507,595 | B1 | 1/2003 | Kapon et al. |
| 7,257,141 | B2 | 8/2007 | Chua |
| 7,397,835 | B2 | 7/2008 | Mochizuki |
| 2005/0019973 | A1 | 1/2005 | Chua |
| 2005/0169336 | A1 | 8/2005 | Ishii et al. |
| 2007/0258499 | A1 | 11/2007 | Mochizuki |

FOREIGN PATENT DOCUMENTS

| JP | 2001-168475 A | 6/2001 |
| JP | 2005-45243 A | 2/2005 |
| JP | 2005-252240 A | 9/2005 |
| JP | 2007-189033 A | 7/2007 |
| JP | 2010-003930 A | 1/2010 |
| JP | 2012-49180 A | 3/2012 |

* cited by examiner

VERTICAL-CAVITY SURFACE-EMITTING LASER DIODE AND OPTICAL TRANSMISSION APPARATUS

CROSS-REFERENCE TO RELATED APPLICATIONS

This application is a continuation of U.S. application Ser. No. 14/452,053 filed Aug. 5, 2014, which is based on and claims priority under 35 USC 119 from Japanese Patent Application No. 2013-163757 filed on Aug. 7, 2013. The entire disclosures of the prior applications are considered part of the disclosure of the accompanying continuation, and are hereby incorporated by reference.

BACKGROUND

1. Technical Field

The present invention relates to a vertical-cavity surface-emitting laser diode and an optical transmission apparatus.

2. Related Art

Recently, a light source capable of providing transmission at a high rate up to about 100 Gb/s with low power consumption is required with the accelerated increase of optical link transmission capacity. In order to use a vertical-cavity surface-emitting laser diode as such a light source, the modulation rate of the vertical-cavity surface-emitting laser diode must be further increased.

SUMMARY

According to an aspect of the invention, there is provided a vertical-cavity surface-emitting laser diode including: a first resonator which has a plurality of semiconductor layers including a first current narrowing structure having a first conductive region and a first non-conductor region; a first electrode which supplies electric power to drive the first resonator; a second resonator which has a plurality of semiconductor layers including a second current narrowing structure having a second conductive region and a second non-conductive region and which is formed side by side with the first resonator, the second current narrowing structure being formed in the same current narrowing layer as the layer where the first current narrowing structure is formed; and a coupling portion which couples the plurality of semiconductor layers in the first resonator with the plurality of semiconductor layers in the second resonator respectively; wherein: the equivalent refractive index of the coupling portion is smaller than the equivalent refractive index of each of the first resonator and the second resonator.

BRIEF DESCRIPTION OF THE DRAWINGS

Exemplary embodiments of the present invention will be described in detail based on the following figures, wherein.

REFERENCE SIGNS LIST

Figure 1:
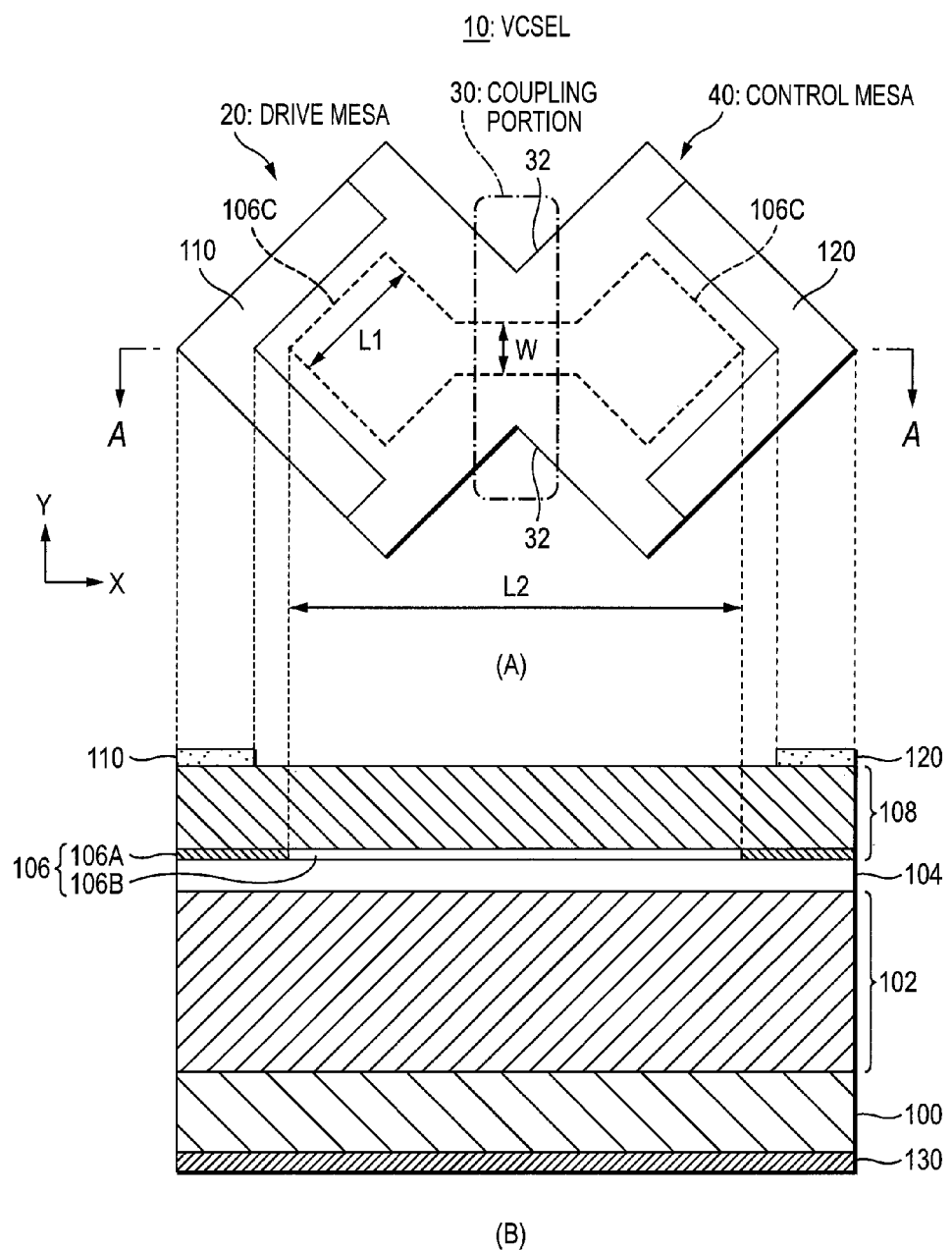
FIG. 1 is a schematic plan view of a vertical-cavity surface-emitting laser diode according to a first Example of the invention and a sectional view of the same vertical-cavity surface-emitting laser diode taken along the line A-A of the plan view.

10: VCSEL
20: drive mesa
30: coupling portion
32: constricted shape
40: control mesa
100: GaAs substrate
102: lower DBR
104: active region
106: current narrowing layer
106A: oxidized region
106B: non-oxidized region
106C: boundary
108: upper DBR
110: drive electrode
120, 122: control electrode
130: n-side electrode
200: insulated region

DETAILED DESCRIPTION

VCSELs (Vertical-Cavity Surface-Emitting Laser diode, hereinafter referred to as VCSEL) according to exemplary embodiments of the invention will be described below with reference to the drawings. In addition, the scale in each drawing is emphasized in order to make it easy to understand features of the invention. Accordingly, it should be noted that the scale in each drawing is not always identical to the scale of a real device.

FIG. 1 includes a schematic plan view of a VCSEL according to a first Example of the invention and a sectional view of the same VCSEL taken along the line A-A of the plan view. As shown in (A) of FIG. 1, the VCSEL 10 according to the Example is configured to include a first columnar structure 20, a coupling portion 30 and a second columnar structure 40 which are formed monolithically on a substrate. The first columnar structure 20 and the second columnar structure 40 are disposed in an X direction. The first columnar structure 20 is coupled to the second columnar structure 40 by the coupling portion 30. The first columnar structure 20 serves as a drive mesa and includes a first resonator. The second columnar structure 40 serves as a control mesa and includes a second resonator. The coupling portion 30 includes semiconductor layers shared with the first columnar structure 20 and the second columnar structure 40. The coupling portion 30 at least optically couples the first columnar structure 20 and the second columnar structure 40 to each other. In a preferable mode, the coupling portion 30 serves for propagating a part of light generated by the first columnar structure 20 toward the second columnar structure 40 and feeding the light reflected on the second columnar structure 40 back to the first columnar structure portion 20.

In (A) of FIG. 1, the first and second columnar structures 20 and 40 are formed substantially symmetrically in the X direction with respect to the coupling portion 30 and the first and second columnar structures 20 and 40 are formed into rectangular shapes in plan view. This is simply an example. The first and second columnar structures 20 and 40 are not necessarily symmetric. The first and second columnar structures 20 and 40 are not limited to the rectangular shapes. Alternatively, the first and second columnar structures may be cylindrical structures or columnar structures formed into elliptical shapes in plan view. The first and second columnar structures may be formed into asymmetric shapes. Further, the first and second columnar structures may have different shapes and different sizes from each other. Incidentally, in the following description, the first columnar structure 20 will be referred to as drive mesa and the second columnar structure 40 will be referred to as control mesa for convenience's sake.

As shown in (B) of FIG. 1, the laminate structure of the VCSEL 10 is the same as a typical 980-nm InGaAs/GaAs triple quantum well structure. That is, the laminate structure of the VCSEL 10 is formed out of a laminate of an n-type lower distributed bragg reflector 102 (hereinafter referred to as DBR), an active region 104 and a p-type upper DBR 108 on an n-type GaAs substrate 100. The n-type lower DBR 102 has AlGaAs layers with different Al compositions stacked alternately. The active region 104 is formed on the lower DBR 102 and includes a quantum well layer interposed between an upper spacer layer and a lower spacer layer. The p-type upper DBR 108 is formed on the active region 104 and has AlGaAs layers with different Al compositions stacked alternately. The n-type lower DBR 102 has a laminate of high refractive index layers and low refractive index layers, such as a laminate of plural pairs of $Al_{0.92}Ga_{0.08}As$ layers and $Al_{0.16}Ga_{0.84}As$ layers. The thickness of each of these layers is $\lambda/4n_r$ ($\lambda$ designates an oscillation wavelength and $n_r$ designates the refractive index of a medium). These layers are stacked alternately by 40 cycles. The carrier concentration after silicon as an n-type impurity is doped is, for example, $3 \times 10^{18}$ cm$^{-3}$.

In the active region 104, the lower spacer layer consists of an undoped $Al_{0.3}Ga_{0.7}As$ layer, the quantum well active layer consists of an undoped $In_{0.2}Ga_{0.8}As$ quantum well layer and an undoped GaAs barrier layer, and the upper space layer consists of an undoped $Al_{0.3}Ga_{0.7}As$ layer.

The p-type upper DBR 108 has a laminate of high refractive index layers and low refractive index layers, such as a laminate of plural pairs of $Al_{0.92}Ga_{0.08}As$ layers and $Al_{0.16}Ga_{0.84}As$ layers. The thickness of each of these layers is $\lambda/4n_r$. These layers are stacked alternately by 25 cycles. The carrier concentration after carbon as a p-type impurity is doped is, for example, $3 \times 10^{18}$ cm$^{-3}$. A current narrowing layer 106 consisting of a p-type $Al_{0.98}Ga_{0.02}As$ layer (or AlAs layer) is formed on or inside the lowermost layer of the upper DBR 108. In addition, a contact layer (for example, $1 \times 10^{19}$ cm$^{-3}$) made of p-type GaAs with a high concentration of impurities may be formed on the uppermost layer of the upper DBR 108.

The current narrowing layer 106 has a higher Al composition than that of each of the lower DBR 102 and the upper DBR 108 so that oxidization in the current narrowing layer 106 can be accelerated in a mesa oxidization process. When the mesas shown in (A) of FIG. 1 are oxidized, oxidized regions 106A (indicated as hatched portions in (B) of FIG. 1) oxidized selectively are formed inward from side walls of the drive mesa 20, the coupling portion 30 and the control mesa 40 so as to form a current narrowing structure. When oxidization proceeds inward at a substantially constant speed, the planar shapes of non-oxidized regions 106B are formed into shapes in which the planar shapes of the mesas 20 and 40 are substantially reflected respectively. The non-oxidized regions 106B are surrounded by the oxidized regions 106A. A broken line 106C in (A) of FIG. 1 schematically designates a boundary between the oxidized regions 106A and the non-oxidized regions 106B. The refractive index of the $Al_{0.98}Ga_{0.02}As$ layer (or AlAs layer) constituting the current narrowing layer 106 is about 3.0. However, when the $Al_{0.98}Ga_{0.02}As$ layer is oxidized, the refractive index of the $Al_{0.98}Ga_{0.02}As$ layer is reduced to be about 1.7. Thus, transverse light is confined in the non-oxidized regions 106B surrounded by the oxidized regions 106A. In addition, since the oxidized regions 106A have high electric resistance, the oxidized regions 106A substantially serve as non-conductive regions. Carriers injected from an electrode are confined in the non-oxidized regions 106B serving as conductive regions. Thus, the current and the light can be confined in the non-oxidized regions 106B due to the current narrowing structure.

The VCSEL 10 according to the Example includes the coupling portion 30 between the drive mesa 20 and the control mesa 40. The coupling portion 30 couples the semiconductor layers of the lower DBR 102, the active region 104 and the upper DBR 108 in the drive mesa 20 with the corresponding semiconductor layers of the lower DBR 102, the active region 104 and the upper DBR 108 in the control mesa 40 respectively. The coupling portion 30 includes an oxidized region 106A and a non-oxidized region 106B for coupling the oxidized region 106A and the non-oxidized region 106B in the drive mesa 20 with the oxidized region 106A and the non-oxidized region 106B in the control mesa 40 respectively. Thus, the drive mesa 20 and the control mesa 40 are coupled optically. In addition, the coupling portion 30 serves for propagating a part of light generated by the drive mesa 20 toward the control mesa 40 and feeding the light reflected on the control mesa 40 back to the drive mesa 20. Accordingly, the equivalent refractive index of the coupling portion 30 is designed to be smaller than the equivalent refractive index of the non-oxidized region 106B in each of the drive mesa 20 and the control mesa 40. The equivalent refractive index used herein designates an effective refractive index of semiconductor multilayer films with different refractive indices laminated vertically on the substrate (the refractive indices of the multilayer films are regarded as the refractive index of a single layer), the effective refractive index being obtained by an equivalent refractive index method. The "equivalent refractive index" is also called as "effective index".

In the example shown in (A) of FIG. 1, the coupling portion 30 according to the Example is processed into a constricted shape 32 whose opposite side surfaces are inclined inward to be narrow in a Y direction. Since the current narrowing layer 106 is oxidized from the side surfaces of the constricted shape 32, the Y-direction width W of the non-oxidized region 106B in the coupling portion 30 is made narrower than the Y-direction width W of the non-oxidized region 106B in each of the drive mesa 20 and the control mesa 40. In this manner, the equivalent refractive index of the coupling portion 30 is controlled to be smaller than the equivalent refractive index of each of the drive mesa 20 and the control mesa 40. Incidentally, the shape and the size of the coupling portion 30 may be selected desirably. When the shape and the size of the coupling portion 30 are selected suitably, the Y-direction width of the non-oxidized region 106B in the coupling portion 30 can be actually made narrower than the Y-direction width of the non-oxidized region 106B in each of the drive mesa 20 and the control mesa 40 to thereby obtain a desired equivalent refractive index. Incidentally, the Y-direction width of the non-oxidized region 106B in the coupling portion 30 may be zero. That is, the non-oxidized region 106B of the drive mesa 20 and the non-oxidized region 106B of the control mesa 40 may be disconnected from each other. In addition, the Y-direction width W of the non-oxidized region 106B in the coupling portion 30 is a factor for determining a coupling amount or coupling efficiency between the drive mesa 20 and the control mesa 40 as will be described later.

P-side electrodes 110 and 120 made of metal and coupled to the resonator of the drive mesa 20 and the resonator of the control mesa 40 independently and respectively are formed on the upper DBR 108. The p-side electrodes 110 and 120 are made of metal such as Au or a laminate of Au/Zn/Au, etc. The p-side electrode 110 is formed into a "V"-shape to extend along two sides of the drive mesa 20 to be thereby electrically connected to the upper DBR 108. In a preferable mode, the p-side electrode 110 is formed in a position not to overlap with the non-oxidized region 106B. In other words, the p-side electrode 110 is formed in a region not to extend beyond the boundary 106C between the oxidized region 106A and the non-oxidized region 106B. Similarly, the p-side electrode 120 is formed into a "V"-shape to extend along two sides of the control mesa 40 to be thereby electrically connected to the upper DBR 108. The p-side electrode 120 is also formed in a region not to extend beyond the boundary 106C between the oxidized region 106A and the non-oxidized region 106B. In addition, an n-side electrode 130 shared by the drive mesa 20 and the control mesa 40 is formed on the back surface of the substrate 100.

The p-side electrode 110 is a drive electrode for driving the drive mesa 20 (hereinafter the p-side electrode 110 will be referred to as drive electrode). The other p-side electrode 120 is a control electrode for controlling the optical feedback of the control mesa 40 (hereinafter the p-side electrode 120 will be referred to as control electrode). In the example in FIG. 1, the drive electrode 110 and the control electrode 120 are formed on the opposite ends of the mesas 20 and 40 respectively. However, the invention is not limited thereto. For example, as long as the VCSEL 10 according to the Example can achieve higher speed than a background-art VCSEL, the drive electrode 110 and the control electrode 120 may be formed in places other than the opposite ends.

The VCSEL 10 in the Example has a coupled resonator structure in which the drive mesa 20 having the drive electrode 110 formed therein and the control mesa 40 having the control electrode 120 formed therein are coupled to each other through the coupling portion 30 having the constricted shape, as described above. Although the rectangular coupled resonators having the same shape are shown in the Example, rectangular coupled resonators having different sizes may be used or coupled resonators having circular shapes other than the rectangular shapes may be used. The length L1 of one side of the non-oxidized region 106B formed in each of the drive mesa 20 and the control mesa 40 is, for example, 8.5 μm. The length L2 of a longer axis of the non-oxidized regions 106B formed in the coupled resonators is, for example, 28 μm. The lengths L1 and L2 of the non-oxidized regions may be made smaller or larger than the aforementioned values in accordance with design. When light in a fundamental transverse mode is emitted from the drive mesa 20, the length L1 may be further reduced.

Thus, the drive mesa 20 and the control mesa 40 having the two vertical resonator structures are formed on the substrate. When a drive signal of a forward bias is applied between the drive electrode 110 and the n-side electrode 130, laser light is emitted from the surface of the upper DBR 108 of the drive mesa 20 vertically to the substrate. The drive signal may be a steady signal for emitting laser light continuously or may be a pulse-like signal for modulating the laser light. In addition, in the Example, it is not always necessary to apply a drive signal to the control electrode 120 of the control mesa 40. In a certain mode, a drive signal of a forward bias not smaller than a threshold which can cause laser oscillation may be applied to the control electrode 120 so that high-rate modulation of the VCSEL 10 can be improved more greatly. Since the drive signal is applied to the control electrode 120, light propagated through the control mesa 40 can be amplified and the phase of the light can be controlled. Thus, the phase of the light optically fed back from the control mesa 40 can be controlled to be a reverse phase. Due to the optical feedback in the reverse phase, the modulation frequency of the drive mesa 20 can be further increased, as will be described later.

Here, the forward bias means a positive voltage applied to the p-type semiconductor layer inside the laser diode and a negative voltage applied to the n-type semiconductor layer. A backward bias means a negative voltage applied to the p-type semiconductor layer inside the laser diode and a positive voltage applied to the n-type semiconductor layer. Incidentally, the negative voltage includes a ground potential (GND).

Figure 2:
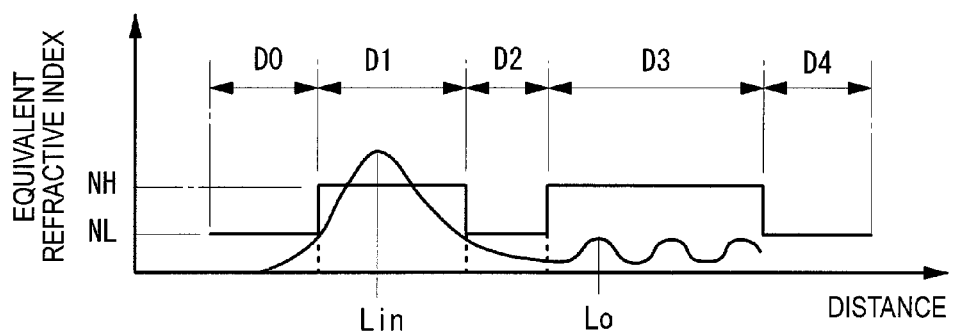
FIG. 2 is a view showing an equivalent refractive index and a light confinement distribution of the vertical-cavity surface-emitting laser diode according to the first Example of the invention.

FIG. 2 shows the relation between the equivalent refractive index and the light confinement distribution of the VCSEL. In FIG. 2, the stepwise line designates the equivalent refractive index and the curve designates the light confinement distribution. A region D0 of a low equivalent refractive index NL corresponds to the oxidized region 106A of the drive mesa 20. A region D1 of a high equivalent refractive index NH corresponds to the non-oxidized region 106B of the drive mesa 20 in the same manner as the region D0. A region D2 of the low equivalent refractive index NL corresponds to a resonator coupling portion constituted by the coupling portion 30. A region D3 of the high equivalent refractive index NH corresponds to the non-oxidized region 106B of the control mesa 40. A region D4 of the low equivalent refractive index NL corresponds to the oxidized region 106A of the control mesa 40.

Most of light Lin generated by the resonator of the drive mesa 20 is confined in the region D1 which is the non-oxidized region 106B. However, since the regions D0, D1, D2, D3 and D4 having high and low equivalent refractive indices are formed continuously, the region D2 of the coupling portion 30 for coupling the two resonators does not completely confine the light Lin in the region D1 but guides a part of the light in the skirt of the region D1 to the control mesa 40. Even when the laser light is resonated vertically in the drive mesa 20, the laser light includes light having a slight inclination angle with respect to the vertical direction. Therefore, a part of light in the skirt is guided to the region D3 of the high equivalent refractive index through the region D2 of the low equivalent refractive index. In the state in which light Lo guided to the control mesa 40 is confined in the control mesa 40, the light Lo is propagated in a horizontal direction while being resonated inside the vertical resonator in a direction of the inclination angle. Accordingly, the propagation time of the light is slower than that of light propagated linearly in the horizontal direction. The light propagated in the horizontal direction while being resonated inside the vertical resonator in the direction of the inclination angle is referred to as slow light.

The slow light is propagated horizontally in the non-oxidized region 106B of the control mesa 40 and then reflected on a light reflection portion provided in an end portion of the non-oxidized region 106B of the control mesa 40. In the Example, the light reflection portion uses the change of the equivalent refractive index. That is, the light is reflected on the boundary 106C between the oxidized region 106A and the non-oxidized region 106B of the control mesa 40. The light reflected on the control mesa 40 is fed back (optically fed back) again to the original resonator of the drive mesa 20 through the coupling portion 30. Incidentally, the light reflection portion is not necessarily limited to the one using the change of the equivalent refractive index. A separate light reflection member may be also attached to an end portion of the control mesa 40.

The slow light travels while being reflected between the lower DBR 102 and the upper DBR 108. Therefore, even when a horizontal distance D3 is small, the distance (the length of an optical path) with which the light actually travels corresponds to several hundred times as long as the distance D3. Accordingly, the propagation time T of the light reflected on the light reflection portion and travelling back and forth inside the slow light portion has the same effect as if the speed of the light has been delayed. In a preferable mode, the length of the optical path or the distance D3 is adjusted so that the light incident on the light reflection portion and the light reflected on the light reflection portion can be set in a reverse phase relation with each other, more preferably, in a reverse phase relation of 180° with each other.

Figure 3:
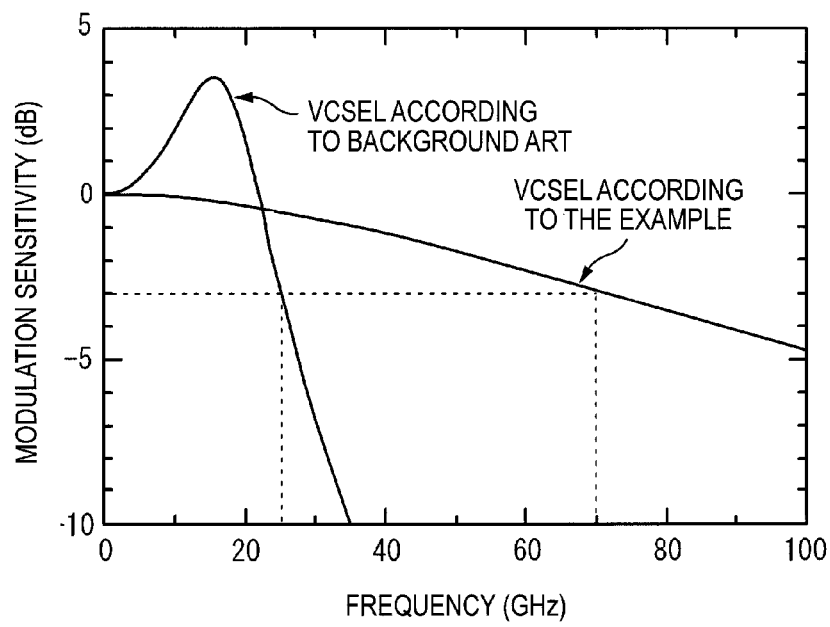
FIG. 3 is a graph showing frequency response characteristic of the vertical-cavity surface-emitting laser diode according to the first Example of the invention.

FIG. 3 shows calculation results of frequency characteristics of the VCSEL having the background-art structure and the VCSEL according to the Example. In FIG. 3, the abscissa designates frequency (GHz) and the ordinate designates modulation sensitivity (dB). Assume that the signal intensity is allowed to decrease up to −3 dB. In this case, the frequency of the VCSEL having the background-art structure in which the control mesa is not coupled is about 25 GHz whereas the frequency of the VCSEL according to the Example is about 70 GHz. Accordingly, it is proved that 3 dB frequency is improved remarkably in the VCSEL 10 according to the Example, in comparison with that in the VCSEL having the background-art structure. The graph of FIG. 3 shows the calculation made when the light is fed back with a reverse phase. When the simulation in which the light is fed back with a reverse phase is compared with another simulation in which the light is fed back with the same phase, the result obtained in the case with the reverse phase is more preferable than the result obtained in the case with the same phase in terms of improvement of the 3 dB frequency. Further, the bandwidth of the 3 dB frequency can be improved also by control of a gain based on injection of the current from the control electrode 120. However, an effect of improvement in the bandwidth can be obtained even in the case where no current is injected from the control electrode 120.

Figure 4:
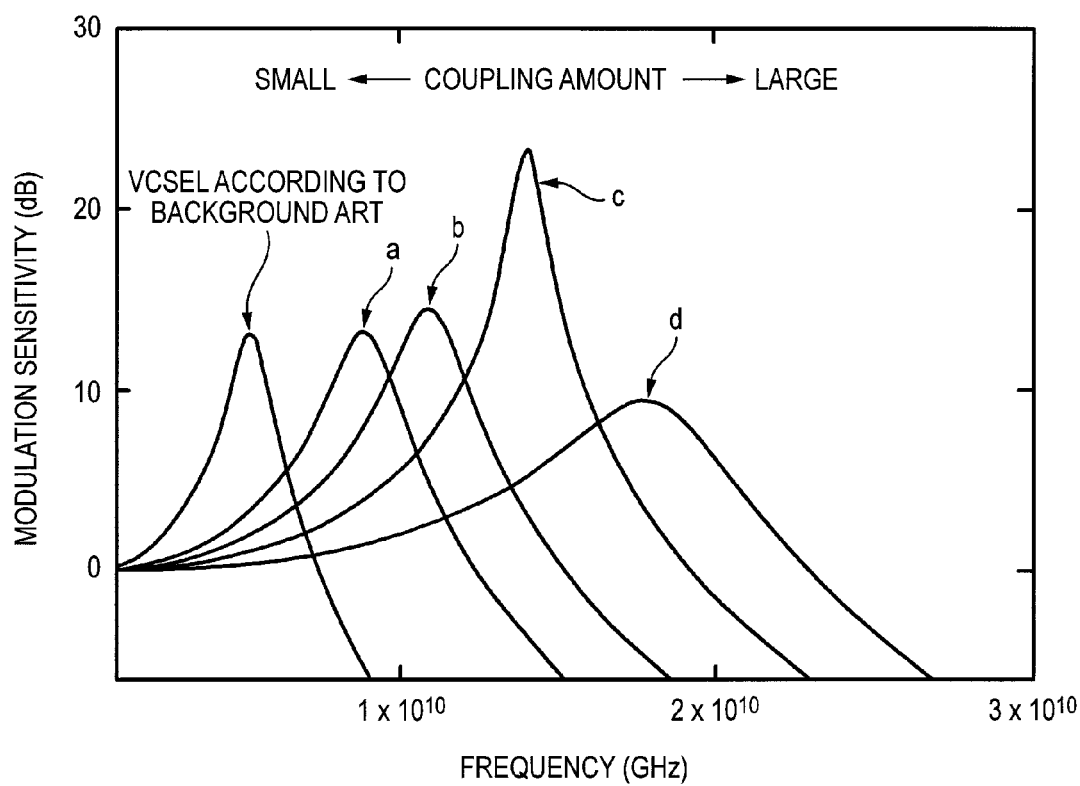
FIG. 4 is a graph showing the relation between coupling efficiency and modulation sensitivity of the vertical-cavity surface-emitting laser diode according to the first Example of the invention.

FIG. 4 shows the change of the bandwidth in the VCSEL due to the coupling amount of the two resonators of the drive mesa and the control mesa. The coupling amount mainly depends on the distance between the drive mesa 20 and the control mesa 40 and the oxidization control of the coupling portion 30. The coupling amount (coupling efficiency) tends to be smaller when the width W of the non-oxidized region 106B in the coupling portion 30 is larger. In FIG. 4, the bandwidth in a VCSEL having no coupling, i.e. the bandwidth in the background-art VCSEL is indicated as the leftmost curve, and the 3 dB bandwidth is a little less than 10 GHz. It can be confirmed that when the coupling amount is increased in the order of curves a, b, c, and d (that is, when the width W of the coupling portion 30 is reduced), the bandwidth of the modulation sensitivity extends on the high frequency side. The coupling amount is a function of the width W. Accordingly, the coupling amount can be controlled when the oxidization of the coupling portion 30 is controlled. That is, when the shape, the size, etc. of the coupling portion 30 are selected, a desired coupling amount can be obtained.

Figure 5:
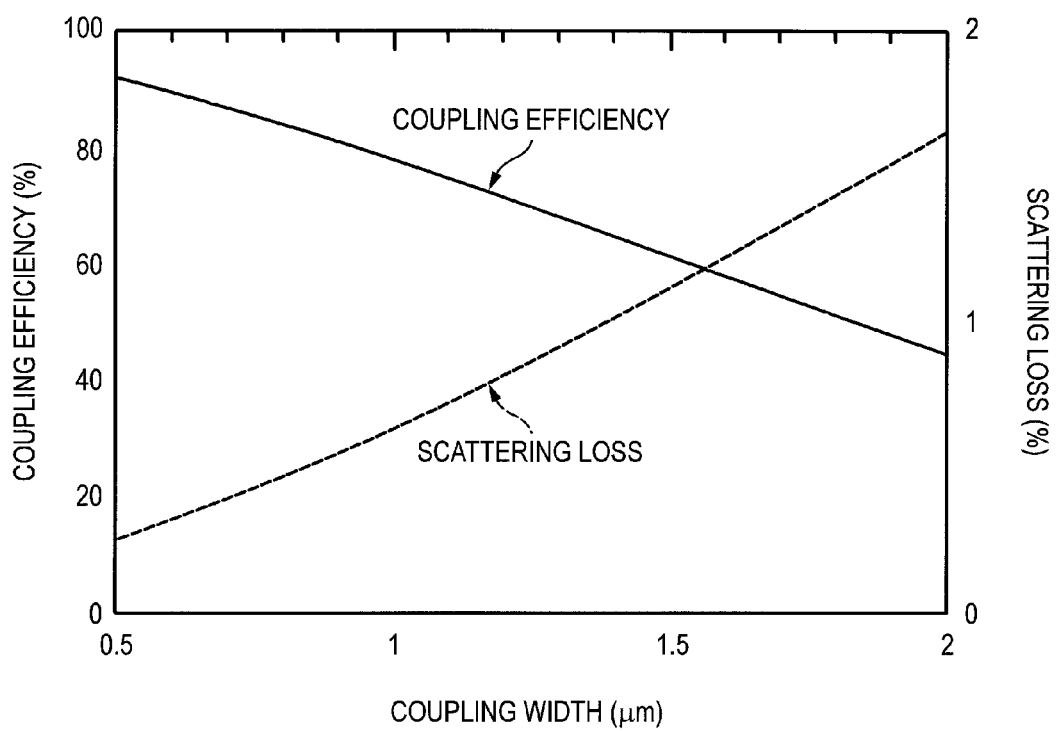
FIG. 5 is a graph showing the relation among a coupling width, coupling efficiency and scattering loss of the vertical-cavity surface-emitting laser diode according to the first Example of the invention.

FIG. 5 shows the relation among the width W of the non-oxidized region in the coupling portion between the two mesas (i.e. the drive mesa and the control mesa), the coupling efficiency (coupling amount) and the scattering loss. As the width W of the coupling portion 30 increases, the scattering loss (broken line in FIG. 5) increases but the coupling efficiency (solid line in FIG. 5) decreases. Since the width W of the coupling portion 30 can be controlled by the distance between the two mesas 20 and 40 and the oxidization narrowing amount of the coupling portion 30 as described above, the coupling portion 30 can be designed suitably to obtain a desired high frequency characteristic by experiments or simulations. Thus, the bandwidth in the VCSEL 10 can be improved.

Figure 6:
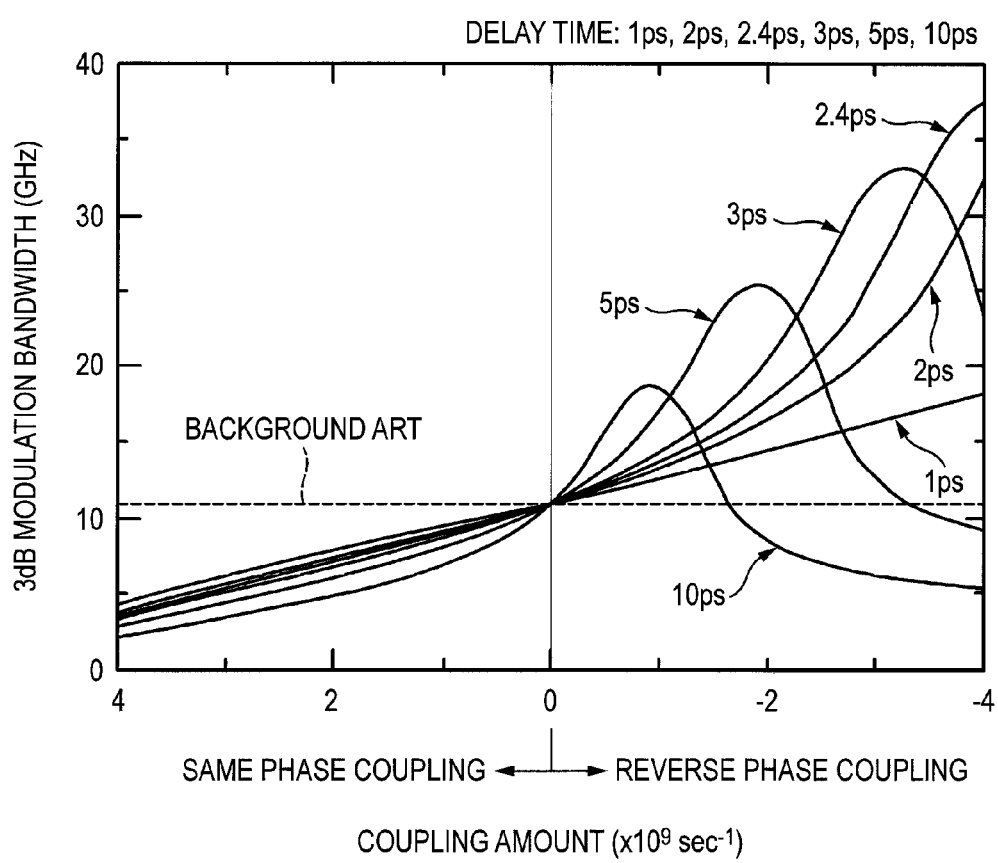
FIG. 6 is a graph showing the relation between a delay time and a modulation bandwidth of the vertical-cavity surface-emitting laser diode according to the first Example of the invention and the relation between reverse phase coupling and same phase coupling and the modulation bandwidth.

FIG. 6 shows the relation between the coupling amount and the 3 dB modulation bandwidth based on the delay time of the optical feedback. The region where the coupling amount is plus corresponds to the case where the optical feedback is performed with the same phase, and the region where the coupling amount is minus corresponds to the case where the optical feedback is performed with a reverse phase. In the VCSEL having the background-art structure without the optical feedback, the 3 dB modulation bandwidth is constant (broken line at about 11 GHz) regardless of the delay time. On the other hand, the illustrated relation is established between the delay time and the 3 dB modulation bandwidth when the control mesa 40 is coupled to perform the optical feedback as in the VCSEL according to the Example. Here is shown, by way of example, each 3 dB modulation bandwidth in which the delay time of the optical feedback is 1 ps, 2 ps, 2.4 ps, 3 ps, 5 ps or 10 ps. The delay time depends on the length of the optical path of the slow light travelling through the control mesa 40, that is, the delay time can be controlled based on the length of the region D3 of the non-oxidized region 106B of the control mesa 40 where the slow light is propagated, as shown in FIG. 2. Particularly in the case of the reverse phase coupling, the 3 dB modulation bandwidth is improved in any delay time. For example, when a delay of about 3 picoseconds is generated in a reverse phase, the 3 dB modulation bandwidth can be improved to about three times as large as that in the VCSEL having the background-art structure.

Thus, in order to improve the 3 dB modulation bandwidth, the optical feedback is set preferably at a reverse phase, most preferably at a reverse phase of 180°. In a first method for setting the optical feedback at a reverse phase, the length of the region D3 of the control mesa 40 is controlled to select an optimal length of the optical path as described above. In a second method, an optimal current is injected from the control electrode 120 of the control mesa 40 to thereby control the phase of light. It is a matter of course that the reverse phase of light optically fed back may be controlled by combination of the first and second methods.

Figure 7:
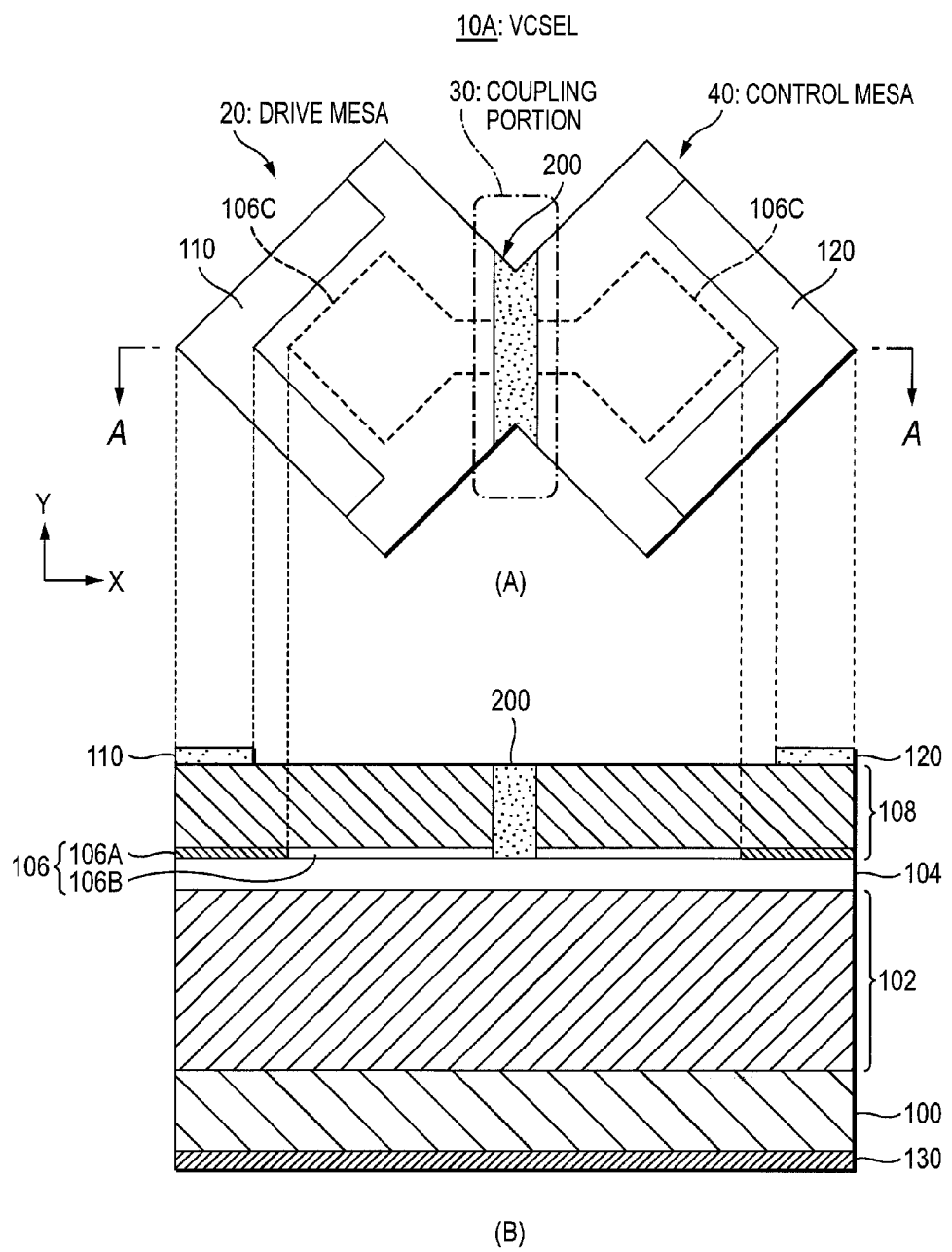
FIG. 7 is a schematic plan view of a vertical-cavity surface-emitting laser diode according to a second Example of the invention and a sectional view of the same vertical-cavity surface-emitting laser diode taken along the line A-A of the plan view.

Next, a second Example of the invention will be described. FIG. 7 includes a schematic plan view of a VCSEL according to the second Example and a sectional view of the same VCSEL taken along the line A-A of the plan view. The different point from the VCSEL 10 according to the first Example shown in FIG. 1 is a point that the VCSEL 10A according to the second Example has an insulation structure in which a coupling portion 30 between the drive mesa 20 and the control mesa 40 is electrically insulated. In the drawings, the same constituents as those of the VCSEL shown in FIG. 1 are referred to by the same signs correspondingly, and description thereof will be omitted.

As shown in FIG. 7, an insulated region 200 having high electric resistance is formed in the coupling portion 30 of the VCSEL 10A. In a preferable mode, a mask pattern for exposing the coupling portion 30 is formed on the upper DBR 108 by a well-known photolithography process and ion injection of protons etc. is performed through the mask pattern so that the insulated region 200 can be formed in the coupling portion 30. In a preferable mode, the energy of the ion injection is controlled so that the entire depth of the p-type upper DBR 108 inside the coupling portion 30 can be insulated. Incidentally, it will go well as long as the insulated region 200 is insulated at least partially on the emission surface side of an active region 104. In a preferable mode, the insulated region 200 is formed all over the range of the coupling portion 30 in the Y direction. However, the insulated region 200 may be formed in a part of the range in the Y direction. In addition, the width of the insulated region 200 in the X direction may be selected desirably.

In the Example, the insulated region 200 is formed in the coupling portion 30 to make a structure in which carriers are prevented from being injected into the coupling portion 30 from the drive electrode 110 or the control electrode 120, so that the decrease of the gain can be suppressed. Further, the scattering loss can be also increased. Accuracy in controlling the optical feedback with the reverse phase can be improved. In addition, in the Example, a certain degree of improvement of the 3 dB modulation bandwidth can be achieved even when no current is injected from the control electrode 120. Incidentally, although the insulated region 200 is formed by ion injection, the insulated region 200 may be formed by another method than ion injection. For example, a groove may be formed in a part or the whole of the upper DBR 108 to thereby provide a function equivalent to the insulated region 200.

Figure 8:
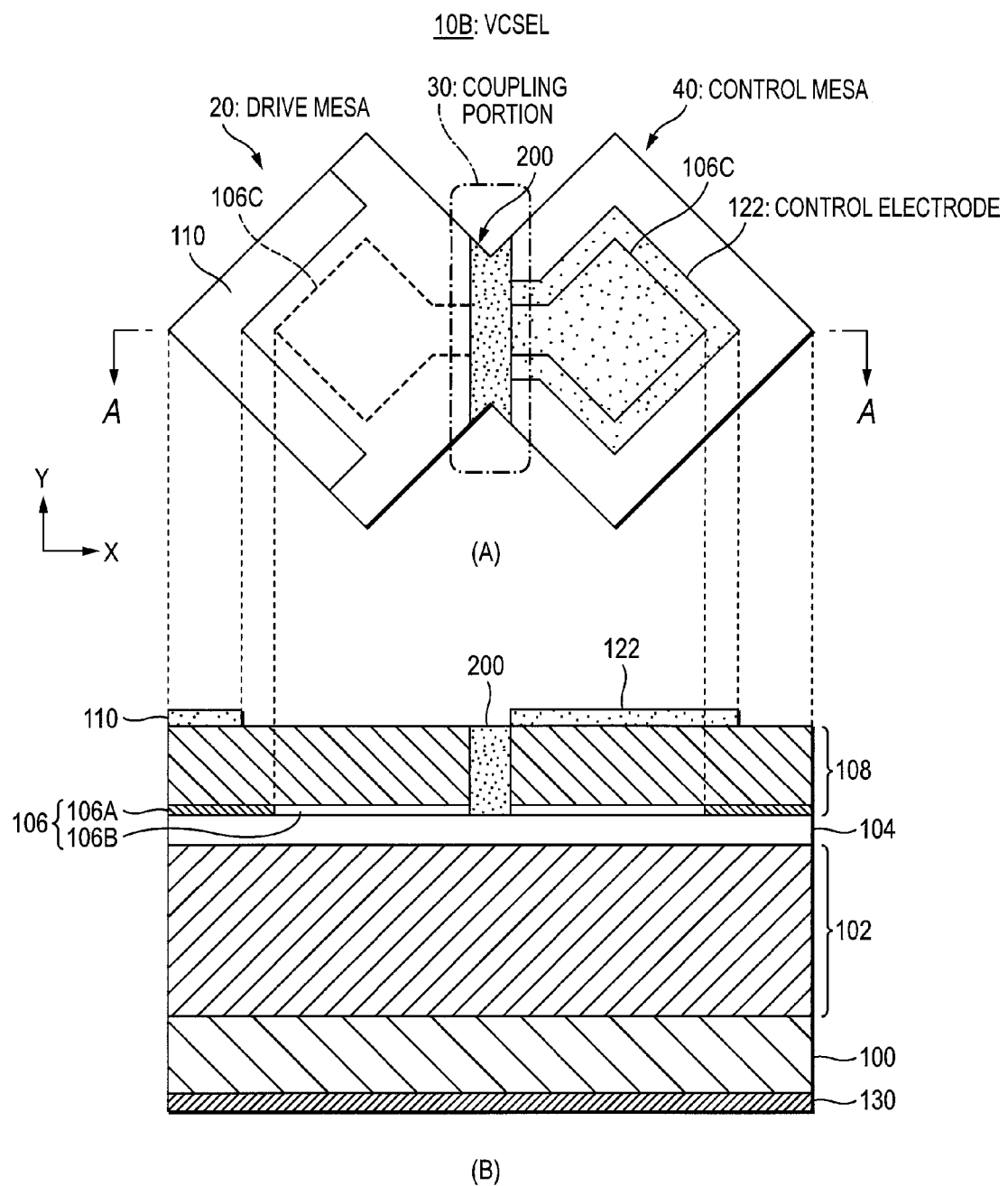
FIG. 8 is a schematic plan view of a vertical-cavity surface-emitting laser diode according to a third Example of the invention and a sectional view of the same vertical-cavity surface-emitting laser diode taken along the line A-A of the plan view.

Next, a third Example of the invention will be described. FIG. 8 includes a schematic plan view of a VCSEL 10B according to the third Example and a sectional view of the VCSEL 10B taken along the line A-A of the plan view. In the VCSEL according to each of the first and second Examples, light is also emitted from the control mesa 40 whereas the VCSEL 10B according to the third Example has a structure in which light emission from the control mesa 40 is suppressed. In FIG. 8, constituents the same as those in the VCSEL shown in FIG. 7 will be referred to by the same signs correspondingly, and description thereof will be omitted.

When light is emitted from two places in the drive mesa 20 and the control mesa 40 respectively due to light emission from the control mesa 40, it is difficult to control the optical mode of the emitted light. Therefore, in the VCSEL 10B according to the Example, a control electrode 122 is formed on the upper DBR 108 to cover the non-oxidized region 106B of the control mesa 40 as shown in FIG. 8 (the control electrode 122 is indicated as a hatched portion in order to make it easy to identify the control electrode 122 in (A) of FIG. 8). In the example shown in FIG. 8, the coupling portion 30 is insulated, for example, by ion injection in the same manner as in the second Example. However, the coupling portion 30 does not have to be particularly isolated as in the first Example.

In the Example, the light emission region is limited to one place in the drive mesa 20. Therefore, it is easy to control the optical mode of the emitted light to thereby lead to improvement of the coupling efficiency with an optical waveguide portion such as an optical fiber, in comparison with the case where light is emitted from two places in the drive mesa 20 and the control mesa 40 respectively.

Incidentally, other than the structure in which the control electrode per se covers the non-oxidized region 106B of the control mesa 40, a structure in which a material having light shielding properties against an oscillation wavelength is added or a dielectric multilayer film reflector etc. is added may be used as a unit for controlling the light emitted from the control mesa 40.

Figure 9:
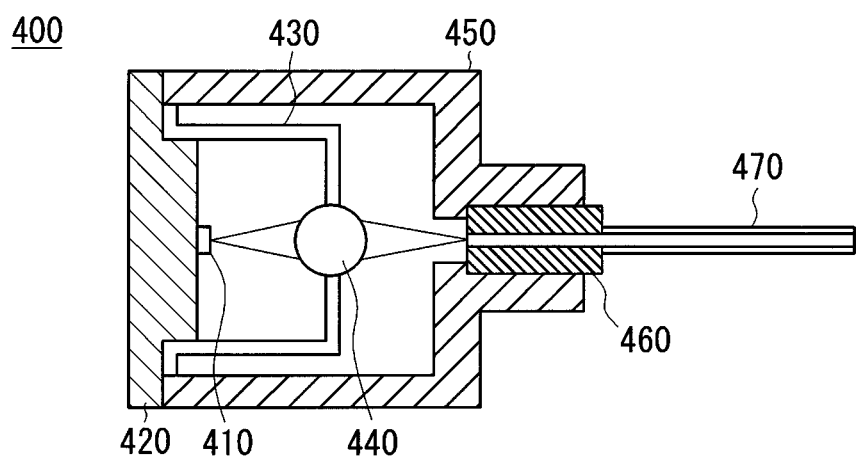
FIG. 9 is a sectional view showing one example of the aspect of an optical transmission apparatus using the vertical-cavity surface-emitting laser diode according to any one of these Examples of the invention.

FIG. 9 is a sectional view showing an example of the configuration of an optical transmission apparatus according to the Example. The optical transmission apparatus 400 includes a metal stem 420 mounted with an electronic component 410 having the VCSEL 10/10A/10B formed therein. The stem 420 is covered with a hollow cap 430. A ball lens 440 is fixed to the center of the cap 430. A cylindrical housing 450 is further attached to the stem 420. An optical fiber 470 is fixed to an end portion of the housing 450 through a ferrule 460. Laser light modulated from the electronic component 410 is condensed by the ball lens 440. The light is incident on the optical fiber 470 and transmitted therefrom. Incidentally, any other lens than the ball lens, such as a biconvex lens or a plano-convex lens, may be used.

Although preferable Examples of the invention have been described above in detail, the invention is not limited to the specific Examples. Various modifications or changes can be made without departing from the scope or spirit of the invention stated in Claims. Although VCSELs using AlGaAs compound semiconductors have been exemplarily described in the Examples, another VCSEL using a group III-V compound semiconductor layer may be used alternatively.

What is claimed is:

1. A vertical-cavity surface-emitting laser diode comprising:
   a first resonator that includes a first current narrowing structure having a first conductive region;
   a second resonator that includes a second current narrowing structure having a second conductive region;
   a coupling portion that couples the first resonator with the second resonator, the coupling portion having a third conductive region, the third conductive region connecting the first conductive region and the second conductive region; and a non-conductive region continuously surrounding the first conductive region, the second conductive region and the third conductive region, wherein:

the first, second, and third conductive regions are formed in a common current narrowing layer, a width of the third conductive region is narrower than each of widths of the first and second conductive region, and an equivalent refractive index of the coupling portion is smaller than an equivalent refractive index of each of the first resonator and the second resonator.

2. The vertical-cavity surface-emitting laser diode according to claim 1, wherein the first, second, and third conductive regions are surrounded by a non-conductive region formed in the common current narrowing layer.

3. The vertical-cavity surface-emitting laser diode according to claim 2, wherein the non-conductive region is an oxidized region.

4. The vertical-cavity surface-emitting laser diode according to claim 2, wherein the first resonator has a first electrode that supplies electric power to the first resonator, and the conductive region of the second resonator is covered with a light-shielding member.

5. The vertical-cavity surface-emitting laser diode according to claim 1, wherein a distance between the first resonator and the second resonator and a width of the coupling portion are set at values with which high frequency characteristics is improved more greatly than the first resonator with which the second resonator is not coupled.

6. The vertical-cavity surface-emitting laser diode according to claim 1, wherein the first resonator has a first electrode that supplies electric power to the first resonator, and the second resonator has a second electrode that controls modulation frequency of the first resonator.

7. The vertical-cavity surface-emitting laser diode according to claim 1, wherein the first resonator is driven by a first drive signal, and the second resonator is driven by a second drive signal different from the first drive signal during the first resonator being driven by the first drive signal.

8. An optical transmission apparatus comprising:
an electronic component including a vertical-cavity surface-emitting laser diode; and
a housing that covers the electronic component and to which an optical fiber is fixed,
wherein the vertical-cavity surface-emitting laser diode includes:
a first resonator that includes a first current narrowing structure having a first conductive region,
a second resonator that includes a second current narrowing structure having a second conductive region,
a coupling portion that couples the first resonator with the second resonator, the coupling portion having a third conductive region, the third conductive region connecting the first conductive region and the second conductive region; and
a non-conductive region continuously surrounding the first conductive region, the second conductive region and the third conductive region, wherein:
the first, second, and third conductive regions are formed in a common current narrowing layer,
a width of the third conductive region is narrower than each of widths of the first and second conductive region, and
an equivalent refractive index of the coupling portion is smaller than an equivalent refractive index of each of the first resonator and the second resonator.

9. The optical transmission apparatus according to claim 8, wherein the first resonator has a first electrode that supplies electric power to the first resonator, and a non-conductive region of the second resonator is covered with a light-shielding member.

10. The vertical-cavity surface-emitting laser diode according to claim 1, wherein the first conductive region, the second conductive region and the third conductive region are non-oxidized regions surrounded by an oxidized region comprising the non-conductive region in the common current narrowing layer.

* * * * *